(12) United States Patent
Krumbein et al.

(10) Patent No.: US 7,202,529 B2
(45) Date of Patent: Apr. 10, 2007

(54) FIELD EFFECT TRANSISTOR

(75) Inventors: Ulrich Krumbein, Rosenheim (DE); Hans Taddiken, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/798,720

(22) Filed: Mar. 11, 2004

(65) Prior Publication Data
US 2004/0238854 A1 Dec. 2, 2004

(30) Foreign Application Priority Data
Mar. 11, 2003 (DE) ................ 103 10 552

(51) Int. Cl.
H01L 29/76 (2006.01)
H01L 29/94 (2006.01)
H01L 31/00 (2006.01)

(52) U.S. Cl. ............ 257/343; 257/335; 257/336; 257/337; 257/339; 257/342; 257/E21.413

(58) Field of Classification Search ........... 257/213, 257/341, 343, 409, 335, 336, 337, 339, 342; 438/247, 305, 306
See application file for complete search history.

(56) References Cited

U.S. PATENT DOCUMENTS

| 5,473,180 | A | | 12/1995 | Ludikhuize | |
|---|---|---|---|---|---|
| 5,705,842 | A | * | 1/1998 | Kitamura et al. | 257/362 |
| 6,242,787 | B1 | * | 6/2001 | Nakayama et al. | 257/493 |
| 6,252,278 | B1 | | 6/2001 | Hsing | |
| 6,326,656 | B1 | * | 12/2001 | Tihanyi | 257/288 |
| 6,765,262 | B2 | * | 7/2004 | Ahlers et al. | 257/328 |
| 6,768,169 | B2 | * | 7/2004 | Tihanyi | 257/341 |
| 6,770,529 | B2 | * | 8/2004 | Lee et al. | 438/247 |
| 6,833,585 | B2 | * | 12/2004 | Kim et al. | 257/343 |
| 2002/0096691 | A1 | * | 7/2002 | Disney | 257/147 |
| 2002/0137292 | A1 | * | 9/2002 | Hossain et al. | 438/289 |
| 2002/0151124 | A1 | * | 10/2002 | Kim et al. | 438/197 |
| 2002/0167082 | A1 | | 11/2002 | Weber et al. | |
| 2002/0179942 | A1 | | 12/2002 | Tihanyi | |
| 2003/0057479 | A1 | | 3/2003 | Ahlers et al. | |
| 2003/0085448 | A1 | * | 5/2003 | Cai et al. | 257/565 |
| 2004/0222461 | A1 | * | 11/2004 | Peyre-Lavigne et al. | 257/333 |
| 2004/0238854 | A1 | * | 12/2004 | Krumbein et al. | 257/213 |

FOREIGN PATENT DOCUMENTS

CN 1103206 A 5/1995

(Continued)

OTHER PUBLICATIONS

Appels, J.A., H.M.J. Vaes, "High Voltage Thin Layer devices (Resurf Devices)", Philips Research Laboratories Eindhoven—Netherlands, IEEE, © 1979, pp. 238-241, (4 pages).

*Primary Examiner*—George Pourson
*Assistant Examiner*—John M. Parker
(74) *Attorney, Agent, or Firm*—Maginot, Moore, Beck

(57) ABSTRACT

A field effect transistor includes a substrate having a doping of a first conductivity type, a drain area in the substrate having a doping of a second conductivity type oppposite the first conductivity type, a source area in the substrate being laterally spaced from the drain area and having a doping of the second conductivity type, and a channel area in the substrate that is arranged between the source area and the drain area. In a portion of the substrate bordering the drain area, an area having a doping of the second conductivity type, which is connected to the drain area, is arranged such that in the portion alternating regions having the first conductivity type and having the second conductivity type are arranged.

20 Claims, 3 Drawing Sheets

FOREIGN PATENT DOCUMENTS

| | | |
|---|---|---|
| DE | 100 12 610 A1 | 9/2001 |
| DE | 100 52 170 C2 | 10/2002 |
| DE | 101 22 364 A1 | 11/2002 |

* cited by examiner

FIELD EFFECT TRANSISTOR

BACKGROUND OF THE INVENTION

1. Field of the Invention

The present invention relates to a field effect transistor with reduced capacitive coupling between drain and substrate.

2. Description of the Related Art

For numerous large signal applications, LDMOS transistors or LDMOS field effect transistors (LDMOS=lateral diffused metal oxide semiconductor) are used, such as for power amplifiers for base stations, hand sets, mobile telephones, etc. The output capacity of a LDMOS field effect transistor is dependent on the drain voltage or the voltage between the drain or the drain area on the one hand and the substrate often connected with a reference potential on the other.

FIG. 3 is a schematic illustration of a vertical section through a conventional LDMOS field effect transistor. A p-doped base substrate 10 comprises a first lower surface 12 and a second upper surface 14. At the lower surface 12, the base substrate 10 comprises a backside contact in the form of a metal coating 16. On the other surface 14 of the base substrate 10 a p-doped epitaxial layer 20 is created by means of an epitaxial method, such as by means of CVD epitaxy (CVD=chemical vapor deposition). The base substrate 10 and the epitaxial layer 20 together form a device substrate 30 with a surface 32 that is at the same time a surface of the epitaxial layer 20 facing away from the base substrate 10.

In or on the epitaxial layer 20, a field effect transistor or its semiconductor function elements are arranged. A source area 40 is formed by an $n^+$-doped area at or directly below the surface 32. A p-doped enhance area 42 borders the side of the source area 40 facing away from the surface 32. A p-doped body area 44, which has, however, in contrast to the enhance area 42, a greater expansion than the source area 40 in at least one direction and thus also laterally borders the source area 40 and the enhance area 42 as well as the surface 32, borders a side of the enhance area 42 facing away from the source area 40 and the surface 32.

A drain area, which is formed from free drain sub-areas 50, 52, 54 with differently high doping concentration in this embodiment, is arranged on the surface 32, laterally spaced from the source area 40 but laterally bordering the body area 44. A first drain sub-area 50 having the greatest distance to the source area 40 is $n^+$-doped. In direction to the source area 40, a second drain sub-area 52 whose doping concentration is lower than that of the first drain sub-area 50 borders the first drain sub-area 50. A third drain sub-area 54 bordering the body area 44 and having a lower doping concentration than the second drain sub-area 52 borders the second drain sub-area 52. The second drain sub-area 52 and the third drain sub-area 54 together are also called resurf area (resurf=reduced surface field).

A $p^+$-doped area 60 on the surface 32 borders a side of the source area 40 facing away from the drain area 50, 52, 54. Between the p+-doped area 60 and the base substrate 10 or its upper surface 14, a p-doped sinker 62 extends that increases the electric conductivity between the p+-doped area 60 and the base substrate 10.

At a side of the p+-doped area 60 and the sinker 62 facing away from the source area 40, the enhance area 42, and the body area 44, further structures 40', 42', 44' border laterally, which are for example a further source area, a further enhance area, and a further body area, or the source area 40, enhance area 42, and the body area 44 that are laterally guided around the p+-doped area 60 and the sinker 62 in the form of an open or closed arc or frame.

On the epitaxial layer 20, electrically conductive structures from metals or other electric conductors are arranged embedded in a dielectric layer 66. A source metallization 70 borders the source area 40 and the p+-doped area 60 and contacts them or is connected thereto in an electrically conductive manner. Throughhole conductors 72 connect the source metallization 70 to shielding conductors 74 overlapping laterally or being arranged partly vertically above the source metallization 70 and being part of an overlying metallization plane in an electrically conductive manner.

A drain metallization 80 borders the most highly doped first drain sub-area 50 and is connected thereto in an electrically conductive manner.

Above the portion of the body area 54 bordering the surface 32, a gate 90 from a doped polysilicon layer 92 and a silicide layer 94 is arranged. The gate 90 or the polysilicon layer 92 thereof is spatially spaced and electrically insulated from the surface 32 or the body area 44 substantially opposite the gate 90 by a thin insulating layer 96 (gate oxide).

When applying a positive voltage to the gate 90, a thin conductive layer, a so-called channel, forms in the body area 44 opposite gate 90 close to the surface 32. The area in which the channel forms when applying the positive voltage is designated as channel area 98 in the following.

A pn-junction is present between the drain area 50, 52, 54 on the one hand and adjacent areas of the epitaxial layer 20 on the other. A space charge zone or a depletion zone forms there. The thickness or expansion of the space charge or depletion zone that is perpendicular to the pn-junction is dependent on the magnitude of the applied drain voltage or on a potential difference between the drain area 50, 52, 54 on the one hand and the substrate 10 on the other hand. The reverse-biased pn-junction between the drain area 50, 52, 54 and the substrate 10 at the same time forms a capacitor whose capacitance is dependent on the thickness of the mentioned space charge zone, and thus on the drain voltage.

As already mentioned above, the output capacitance, which is dependent on the drain voltage, or the capacitance between the drain area 50, 52, 54 and the substrate 10, complicates the matching of a circuit therewith, which is connected to the field effect transistor. Previously, this output capacitance of the field effect transistor, which is dependent on the drain voltage, had to be tolerated.

SUMMARY OF THE INVENTION

It is the object of embodiments of the present invention to provide a field effect transistor having a capacitance that is substantially independent of the drain voltage between a drain area and a substrate.

In accordance with a first aspect, the present invention provides a field effect transistor having a substrate (30) having a doping of a first conductivity type; a drain area in the substrate having a doping of a second conductivity type opposite to the first conductivity type; a source area in the substrate being laterally spaced from the drain area and having a doping of the second conductivity type; a channel area in the substrate that is arranged between the source area and the drain area; and an area having a doping of the second conductivity type and connected to the drain area and arranged in a portion of the substrate adjacent to the drain area such that alternating regions having the first conductivity type and having the second conductivity type are disposed in the portion.

The present invention provides a field effect transistor with a substrate with a doping of a first conductivity type, a drain area in the substrate with a doping of a second conductivity type opposite to the first conductivity type, a source area and a substrate being laterally spaced from the drain area and having a doping of the second conductivity type, and a channel area in the substrate disposed between the source area and the drain area. To the drain area, an area with a doping of the second conductivity type is connected, which is disposed in a portion of the substrate bordering the drain area such that alternating regions with the first conductivity type and with the second conductivity type are arranged in the portion.

According to a preferred embodiment, the present invention provides a semiconductor chip with the inventive field effect transistor.

The present invention is based on the finding to provide an area below the drain area, which causes complete depletion within a layer, which is as thick as possible but independent of the drain voltage, already at low drain voltages due to its spatial structure, so that no more or no substantial change of the thickness of the depletion zone occurs at higher drain voltages. This is for example achieved by the area having one or more columns or lamellae or the form of one or more columns or lamellae with a doping whose charge carrier type equals that of the drain area and is opposite to that of the substrate. The thickness of the columns or lamellae and the dimensions of the areas of the oppositely doped substrate remaining therebetween are chosen so (small) that, already at a drain voltage as low as possible, space charge zones are created that completely fill the columns or lamellae and the gaps therebetween.

A substantial advantage of the present invention is that from a predetermined minimum drain voltage on, at which the space charge zones, as mentioned, completely fill both the columns or lamellae of the area and the substrate material in their surroundings, a spatial expansion and in particular the thickness of this depletion zone is substantially only dependent on the geometry of these columns or lamellae and no longer on the drain voltage. The capacitance between the drain area and the substrate is then largely independent of the drain voltage. This enables simple, inexpensive, and efficient high-frequency matching of a circuit in which the inventive field effect transistor is used to the field effect transistor.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
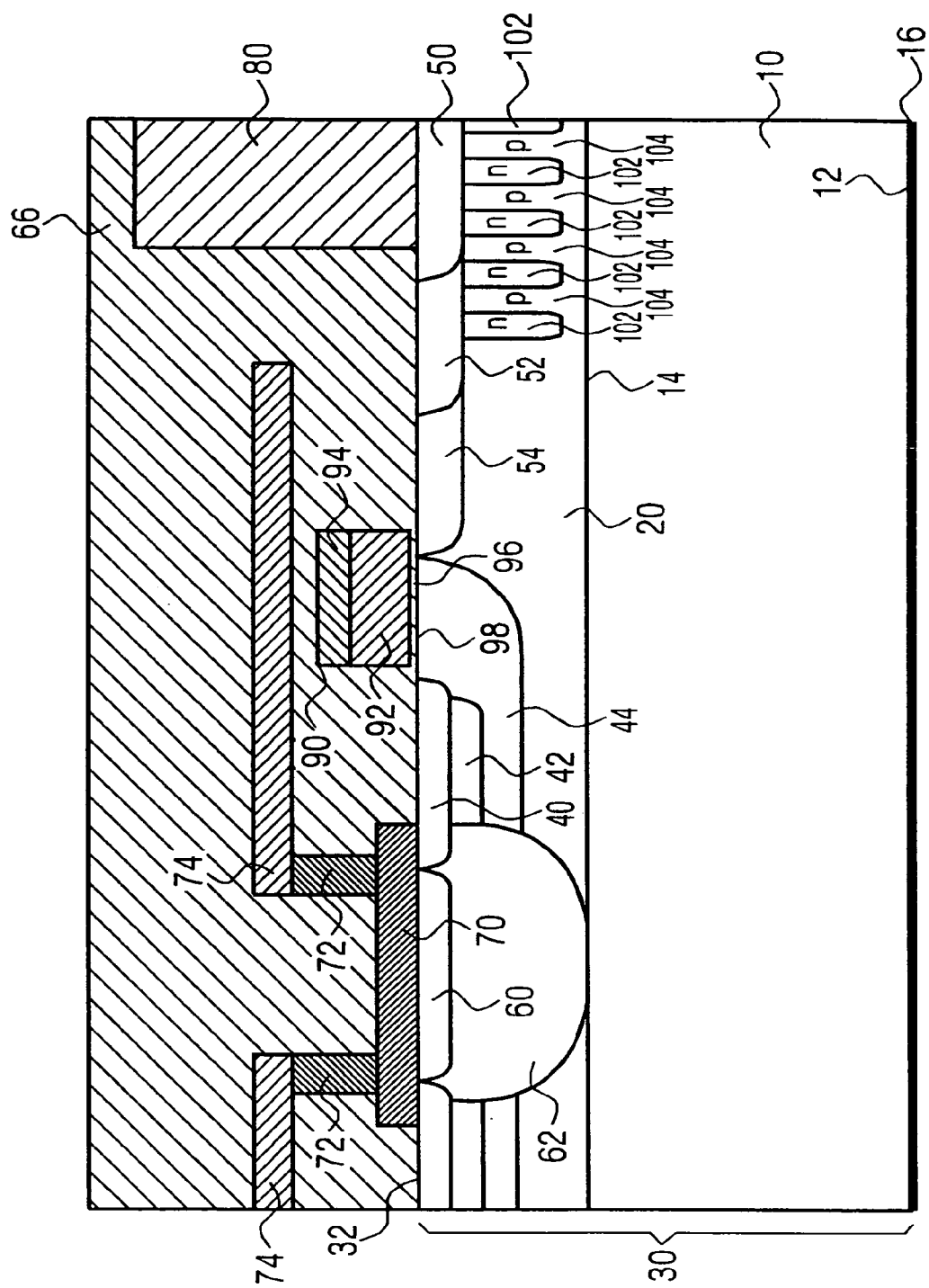
FIG. 1 shows a schematic sectional illustration of a field effect transistor according to a first embodiment of the present invention.
Figure 3:
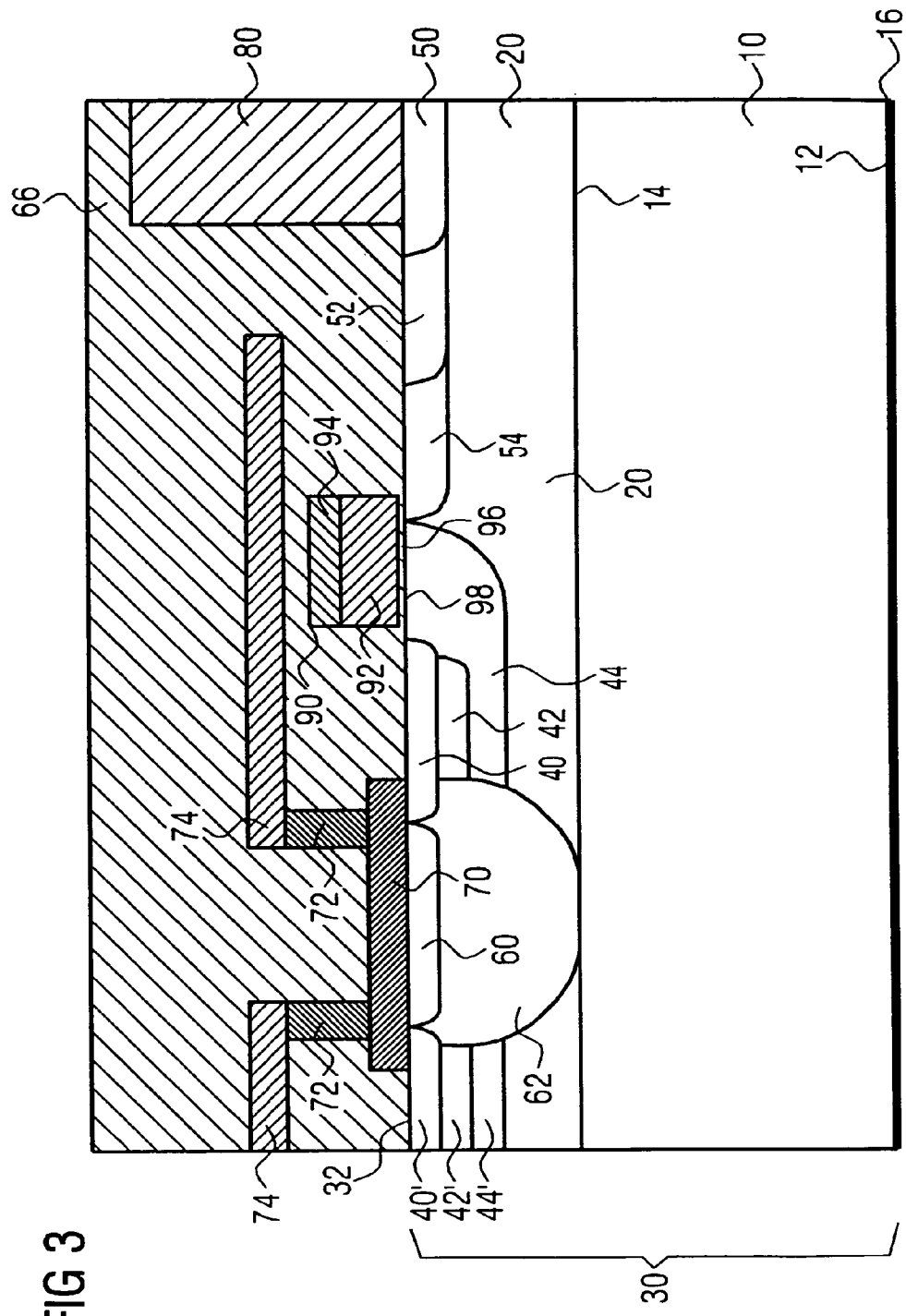
FIG. 3 shows a schematic sectional illustration of a conventional field effect transistor.

FIG. 1 is a schematic illustration of a vertical section through a field effect transistor according to a first embodiment of the present invention. This field effect transistor differs from the conventional field effect transistor described above on the basis of FIG. 3 in that, below the drain area 50, 52, 54 and in particular below the two more highly doped drain sub-areas 50, 52, an area from a plurality of columns 102 is disposed, which is n-doped like the drain area 50, 52, 54. The n-doped columns 102 are disposed perpendicularly to the surface 32 of the epitaxial layer 20 and immediately border the drain area 50, 52, 54 so that they are connected thereto in an electrically conductive manner. The columns 102 have a diameter as small as possible and a mutual or lateral distance as small as possible or gaps 104 as small as possible. Thereby the space charge zones originating from the border areas between the columns 102 and the surrounding material at the epitaxial layer are enabled to completely fill the columns 102 and the gaps 104 between the columns 102 as quickly as possible or at a drain voltage as low as possible when applying a drain voltage and thus when applying a voltage between the n-doped columns 102 and the p-doped material of the epitaxial layer 20 surrounding them in reverse direction.

The length of the columns 102 is preferably chosen so that they have a small vertical distance from the upper surface 14 of the base substrate 10, which has approximately the same size as the distance between the columns 102 and the diameter of the columns 102. When applying the above described minimum drain voltage, the epitaxial layer 20 is thus completely depleted below the most highly doped drain sub-areas 50, 52. If the drain voltage is further increased starting from the minimum drain voltage, the depletion zone only grows minimally in vertical direction. Growth of the depletion zone dependent on the drain voltage is further strongly restricted if the base substrate 10 has a high doping concentration or at least a substantially higher doping concentration than the epitaxial layer 20. In the embodiment shown in FIG. 1 of the inventive field effect transistor, the capacity between the drain area 50, 52, 54 and the substrate 10 is thus approximately the capacity of a corresponding capacitor with a plate distance that is largely constant independently of the drain voltage and corresponds to the thickness of the epitaxial layer 20 minus the thickness or the vertical dimension of the drain area 50, 52, 54. The capacity between the drain area 50, 52, 54 and the substrate 10 is thus small and approximately constant.

The present invention thus causes leveling of the output capacity in the area of the restricted layer and in particular in the area of the restricted layer forming between drain and substrate.

According to a variant of the first embodiment of the present invention, instead of the columns 102, lamellae or plates are disposed below the drain area 50, 52, 54, which border it and extend approximately to the upper surface 14 of the base substrate 10 in vertical direction. FIG. 1 may also be interpreted so that the visible structures 102 are cross-sectional areas of these lamellae or plates. Instead of several lamellae or plates, alternatively only one lamella is provided that laterally has the form of a spiral.

Figure 2:
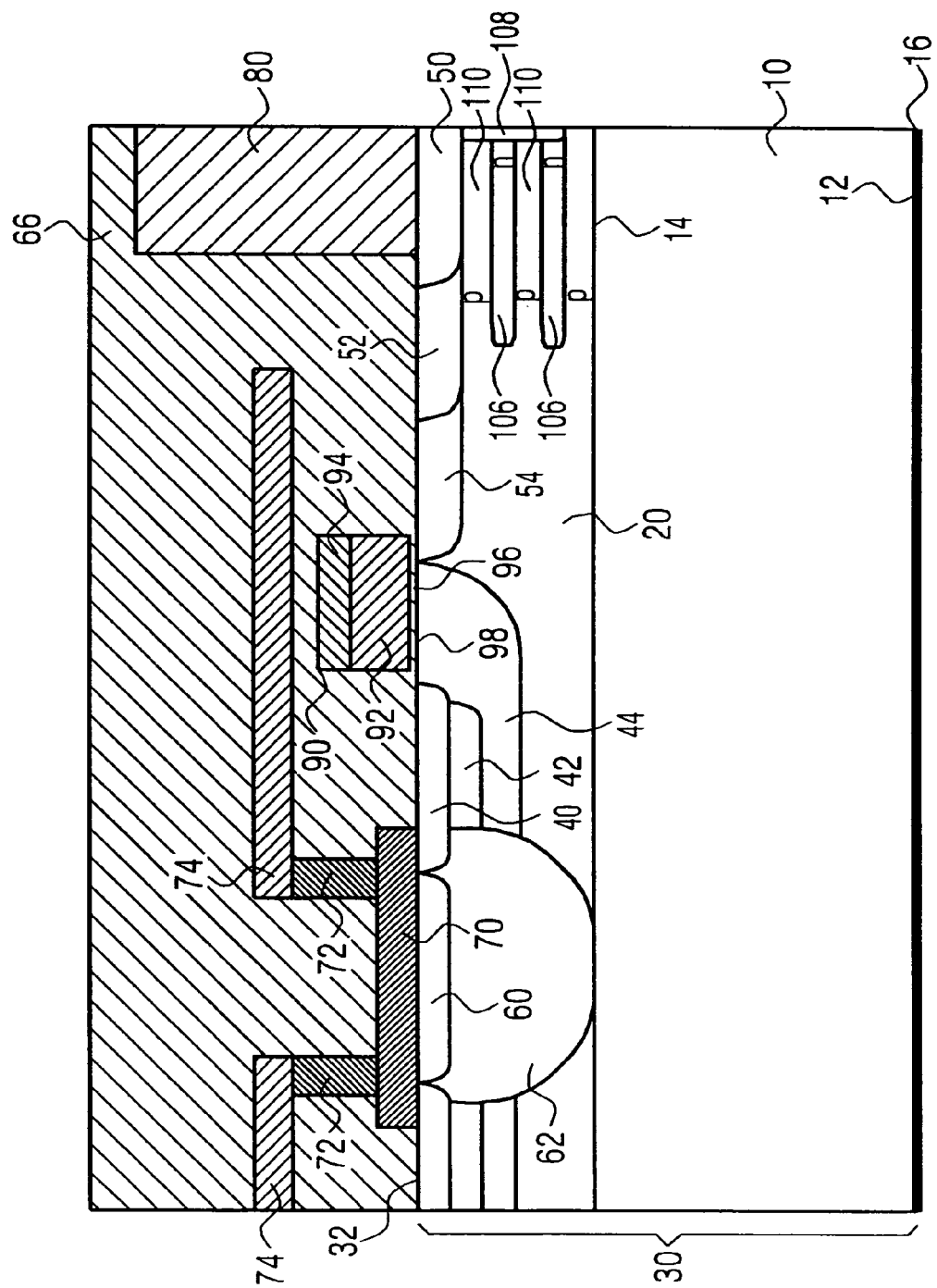
FIG. 2 shows a schematic sectional illustration of a field effect transistor according to a second embodiment of the present invention.

FIG. 2 is a schematic illustration of a vertical section through a field effect transistor according to a second embodiment of the present invention. The second embodiment differs from the first embodiment illustrated on the basis of FIG. 1 in that, instead of the vertical columns or lamellae or plates 102, n-doped columns or rods that are horizontal or arranged in parallel to the surface 32 of the epitaxial layer 20, or plates or lamellae 106 are provided that are connected to a drain area 50, 52, 54 in a geometrical and electrically conductive manner via a further n-doped, but vertically-aligned, rod, column, plate, or lamella-shaped connection area 108. The rods or plates 106 of the second embodiment as well as gaps 110 therebetween are preferably similarly or equally dimensioned as the columns or lamellae 102 of the first embodiment and have the same function.

The embodiments from FIGS. 1 and 2 have in common that the area 102, 106, 108 formed from the columns, rods, lamellae or plates has a comb-shaped cross section at least along one sectional plane. With the vertical orientation of the columns or lamellae 102, as the first embodiment illustrated on the basis of FIG. 1 comprises them, a plurality or a multiplicity of columns or lamellae 102 or a single laterally spiral-shaped lamella 102 is preferably provided, so that the created depletion zone has a lateral expansion as great as possible that preferably corresponds approximately to the lateral expansion of at least the more highly doped drain sub-areas 50, 52. In the case of the horizontally-aligned structures of the second embodiment illustrated on the basis of FIG. 2, a plate 106 with corresponding lateral expansion is sufficient to realize the above-described advantages of the present invention. A plurality of parallel plates 106, however, is advantageous, since it causes a correspondingly thicker depletion zone. A single plate 106 that is horizontal or is parallel to the surface 32 does not have a comb-shaped cross section. But the described embodiments and their variants have in common that they create an alternating arrangement of areas or alternating areas with opposing conductivity types.

A field effect transistor according to the present invention is preferably manufactured by a method whose procedural steps partly correspond to a conventional manufacturing method. In particular, at first the base substrate, for example a single-crystal silicon substrate, is created by for example a corresponding slice being cut from a drawn single-crystal of silicon and their surfaces being polished. The epitaxial layer 20 is grown onto the upper surface 14 of the base substrate 10. The vertically orientated columns or lamellae 102 of the first embodiment are preferably created by holes or trenches being etched in the finished epitaxial layer 20, which are filled with silicon whose doping has a conductivity type that is opposite to the conductivity type of the substrate 10 and in particular the epitaxial layer 20. Alternatively, at first only a sub-layer of the epitaxial layer 20 is created, which includes the area of the future columns or lamellae 102. After creating the columns or lamellae 102, a further sub-layer of the epitaxial layer 20 is deposited, in which the drain area 50, 52, 54 will be disposed later.

Alternatively, the columns or lamellae 102 are created after creating the epitaxial layer 20 by implantation of dopant atoms through a corresponding mask.

Alternatively, the epitaxial layer 20 is created in several sub-layers in which sub-pieces of the columns or lamellae 102 are each created by implantation, wherein these sub-pieces are laterally aligned and together form the columns or lamellae 102.

Horizontal structures, as they are present in the second embodiment illustrated on the basis of FIG. 2, are preferably created by the epitaxial layer 20 being deposited in several sub-layers, wherein the horizontal rods or beams or plates 106 are created by implantation of dopant atoms or by etching corresponding trenches or recesses and filling them with doped silicon.

The creation of the drain area 50, 52, 54, the source area 40, the enhance area 42, the body area 44, the p+-doped area 60, and the sinker 62 preferably takes place, as well as the creation of the conductor structures 70, 72, 74, 80 and the gate 90, in a similar manner as in conventional field effect transistors.

The present invention has been described for a LDMOS field effect transistor with n-doped source and drain areas 40, 50, 52, 54 and a p-doped body area 44 in a p-doped epitaxial layer 20 on a p-doped base substrate 10. The present invention, however, may be realized for all kinds of field effect transistors, in particular lateral field effect transistors in all kinds of semiconductor substrates with and without epitaxial layer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A field effect transistor comprising:
    a substrate having a first conductivity type;
    a drain area in the substrate having a second conductivity type opposite to the first conductivity type;
    a source area in the substrate laterally spaced from the drain area and having a doping of the second conductivity type;
    a channel area in the substrate disposed between the source area and the drain area; and
    a plurality of regions of the second conductivity type, each of the plurality of regions having a first end and a second end, the first end being directly connected to the drain area, and the second end being open and extending into a portion of the substrate having the first conductivity type, such that alternating regions having the first conductivity type and having the second conductivity type are formed below the drain area.

2. The field effect transistor of claim 1, wherein the plurality of regions comprise a plurality of parallel columns.

3. The field effect transistor of claim 1, wherein the plurality of regions has a comb-shaped cross section.

4. The field effect transistor of claim 1, wherein the substrate comprises a surface at which the source area, the channel area, and the drain area are arranged, and wherein the plurality of regions extend in a parallel manner generally away from the surface of the substrate.

5. The field effect transistor of claim 1, wherein:
    the substrate comprises a base substrate having a surface and an epitaxial layer epitaxially grown on the surface of the base substrate;
    the source area, the drain area, and the channel area are disposed in the epitaxial layer; and
    the plurality of regions extend from the drain area towards the surface of the base substrate.

6. The field effect transistor of claim 1, wherein the drain area includes a low-doped drain sub-area having a plurality of drain portions in which a doping concentration in a direction toward the channel area decreases.

7. The field effect transistor of claim 6, wherein a lateral dimension of at least one of the plurality of regions is at least as great as a lateral dimension of a most highly doped portion of the plurality of drain portions.

8. The field effect transistor of claim 6, wherein the low-doped drain sub-area includes three laterally adjacent drain portions.

9. A field effect transistor comprising:
    a substrate having a first conductivity type;
    a drain area in the substrate having a second conductivity type opposite to the first conductivity type;

a source area in the substrate laterally spaced from the drain area and having a doping of the second conductivity type;

a channel area in the substrate disposed between the source area and the drain area; and a plurality of regions of the second conductivity type, each of the plurality of regions having a first end and a second end, the first end being directly connected to the drain area, and the second end being open and extending into a portion of the substrate having the first conductivity type, such that alternating regions having the first conductivity type and having the second conductivity type are formed below the drain area;

wherein the substrate comprises a surface at which the source area, the channel area, and the drain area are arranged, and wherein the plurality of regions extend in a parallel manner generally away from the surface of the substrate.

10. The field effect transistor of claim 9, wherein the plurality of regions comprise a plurality of parallel columns.

11. The field effect transistor of claim 9, wherein the plurality of regions has a comb-shaped cross section.

12. The field effect transistor of claim 1, wherein the substrate comprises a surface at which the source area, the channel area, and the drain area are arranged, and wherein the plurality of regions extend in a parallel manner generally parallel to the surface of the substrate.

13. A field effect transistor comprising:
a substrate having a first conductivity type;
a drain area in the substrate having a second conductivity type opposite to the first conductivity type;
a source area in the substrate having a doping of the second conductivity type;
a channel area in the substrate disposed between the source area and the drain area; and
a plurality of regions of the second conductivity type, each of the plurality of regions having a first end and a second end, the first end being electrically connected to the drain area, and the second end in contact with a portion of the substrate having the first conductivity type, wherein that the plurality of regions of the second conductivity type are not connected at their second ends by material of the second conductivity type and alternating regions having the first conductivity type and having the second conductivity type are formed below the drain area.

14. The field effect transistor of claim 13, wherein the plurality of regions comprise a plurality of parallel columns.

15. The field effect transistor of claim 13, wherein the plurality of regions has a comb-shaped cross section.

16. The field effect transistor of claim 13, wherein the substrate comprises a surface at which the source area, the channel area, and the drain area are arranged, and wherein the plurality of regions extend in a parallel manner generally away from the surface of the substrate.

17. The field effect transistor of claim 16, wherein:
the substrate comprises a base substrate having a surface and an epitaxial layer epitaxially grown on the surface of the base substrate;
the source area, the drain area, and the channel area are disposed in the epitaxial layer; and
the plurality of regions extend from the drain area towards the surface of the base substrate.

18. The field effect transistor of claim 13, wherein the drain area includes a low-doped drain sub-area having a plurality of drain portions in which a doping concentration in a direction toward the channel area decreases.

19. The field effect transistor of claim 18, wherein a lateral dimension of at least one of the plurality of regions is at least as great as a lateral dimension of a most highly doped portion of the plurality of drain portions.

20. The field effect transistor of claim 18, wherein the low-doped drain sub-area includes three laterally adjacent drain portions.

* * * * *